(12) United States Patent
Konishi

(10) Patent No.: US 11,482,646 B2
(45) Date of Patent: Oct. 25, 2022

(54) LIGHTING APPARATUS HAVING MOUNTING SUBSTRATE FOR LED LIGHTING

(71) Applicant: DENKA COMPANY LIMITED, Tokyo (JP)

(72) Inventor: Masahiro Konishi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 157 days.

(21) Appl. No.: 16/763,167

(22) PCT Filed: Nov. 6, 2018

(86) PCT No.: PCT/JP2018/041225
§ 371 (c)(1),
(2) Date: May 11, 2020

(87) PCT Pub. No.: WO2019/093339
PCT Pub. Date: May 16, 2019

(65) Prior Publication Data
US 2021/0376197 A1     Dec. 2, 2021

(30) Foreign Application Priority Data
Nov. 13, 2017   (JP) .............................. JP2017-218601

(51) Int. Cl.
*H01L 33/50*     (2010.01)
*F21V 19/00*     (2006.01)
(Continued)

(52) U.S. Cl.
CPC .......... *H01L 33/50* (2013.01); *F21V 19/0025* (2013.01); *H01L 25/0753* (2013.01);
(Continued)

(58) Field of Classification Search
CPC ......... F21K 9/64; H01L 33/486; H01L 33/50; H01L 25/0753; F21V 19/0025
See application file for complete search history.

(56) References Cited

U.S. PATENT DOCUMENTS

2011/0215348 A1    9/2011   Trottier et al.
2012/0075836 A1*   3/2012   Uemura .............. H01L 25/0753
                                          362/84
(Continued)

FOREIGN PATENT DOCUMENTS

CN           105378952 A     3/2016
CN           106163113 A    11/2016
(Continued)

OTHER PUBLICATIONS

Sep. 3, 2021 Office Action issued in Chinese Patent Application No. 201880072761.4.
(Continued)

*Primary Examiner* — Karabi Guharay
(74) *Attorney, Agent, or Firm* — Oliff PLC

(57) ABSTRACT

Glare and/or multiple shadows are reduced and/or prevented in an SMD-type lighting fixture using high-power CSP devices. A lighting apparatus includes: a substrate having a plurality of conduction parts; and a plurality of surface mount-type LED elements mounted so as to be connected to the respective plurality of conduction parts which the substrate has, the individual elements being separately sealed, wherein the substrate includes a fluorescent substance layer containing a first fluorescent substance, the layer covering at least part of a surface on a side where the plurality of surface mount-type LED elements are mounted, the first fluorescent substance is excited at a wavelength of emitted light from at least one of the plurality of surface mount-type LED ele-
(Continued)

ments, and the plurality of surface mount-type LED elements are not integrally sealed.

10 Claims, 4 Drawing Sheets

(51) Int. Cl.
   *H01L 25/075* (2006.01)
   *H01L 33/48* (2010.01)
   *H01L 33/60* (2010.01)
   *F21Y 115/10* (2016.01)

(52) U.S. Cl.
   CPC ............ *H01L 33/486* (2013.01); *H01L 33/60* (2013.01); *F21Y 2115/10* (2016.08)

(56) References Cited

U.S. PATENT DOCUMENTS

| | | |
|---|---|---|
| 2012/0161194 A1 | 6/2012 | Matsuda et al. |
| 2015/0048395 A1 | 2/2015 | Vampola et al. |
| 2016/0190400 A1 | 6/2016 | Jung et al. |
| 2019/0157519 A1 | 5/2019 | Jung et al. |

FOREIGN PATENT DOCUMENTS

| | | |
|---|---|---|
| CN | 206401358 U | 8/2017 |
| EP | 3 133 653 A1 | 2/2017 |
| JP | 2011-090972 A | 5/2011 |
| JP | 2013-243052 A | 12/2013 |
| JP | 2015-511775 A | 4/2015 |
| JP | 2017-139309 A | 8/2017 |
| KR | 10-2016-0058473 A | 5/2016 |
| WO | 2013/144927 A1 | 10/2013 |

OTHER PUBLICATIONS

Nov. 18, 2020 Search Report issued in European Application No. 18875881.7.
Jan. 22, 2019 International Search Report issued in International Patent Application No. PCT/JP2018/041225.

\* cited by examiner

[Figure 1]
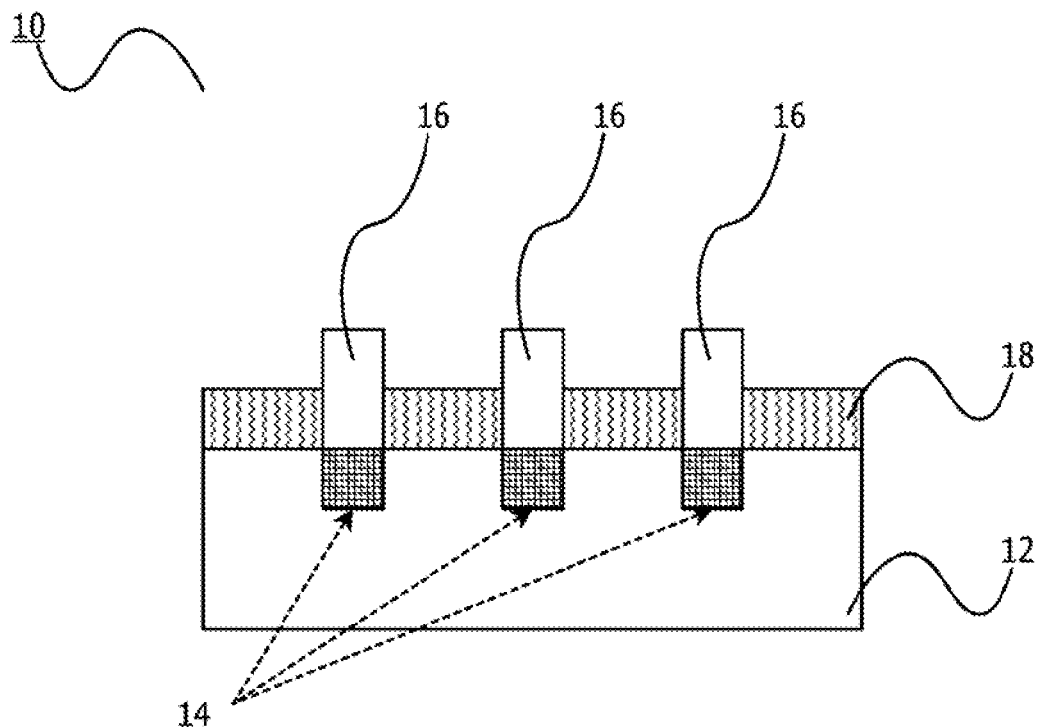
[Figure 2]
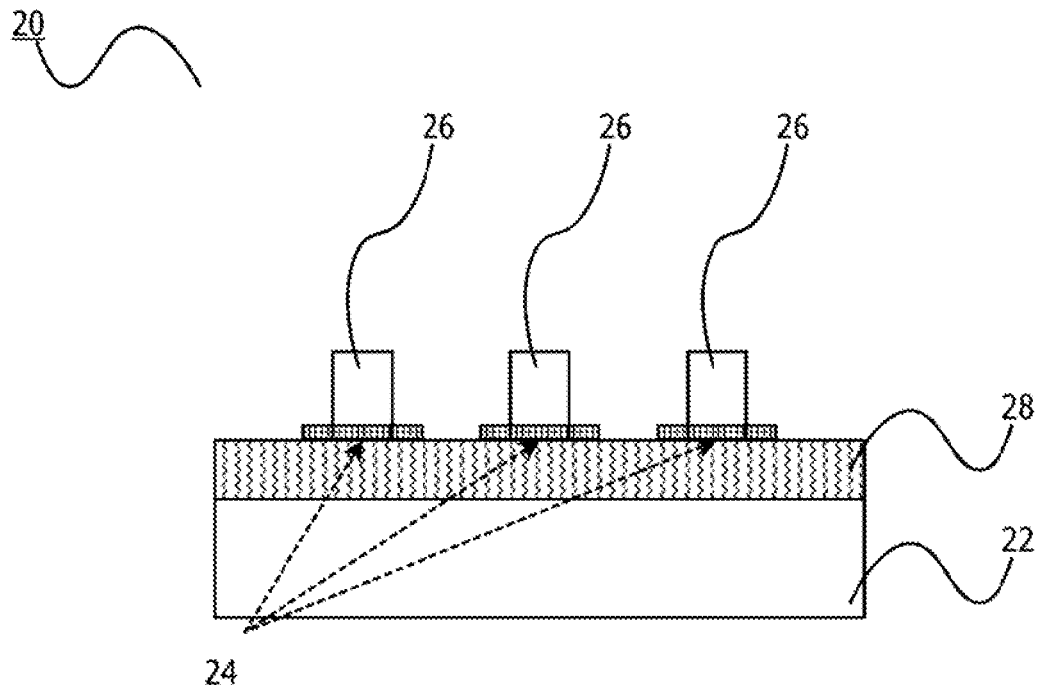

[Figure 3]
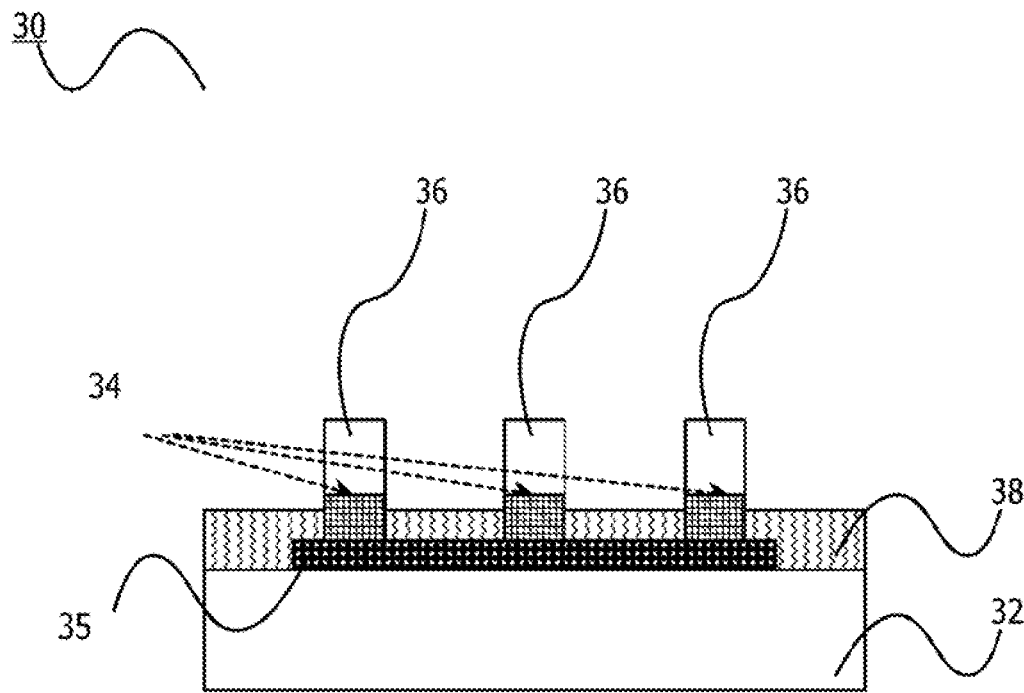
[Figure 4]
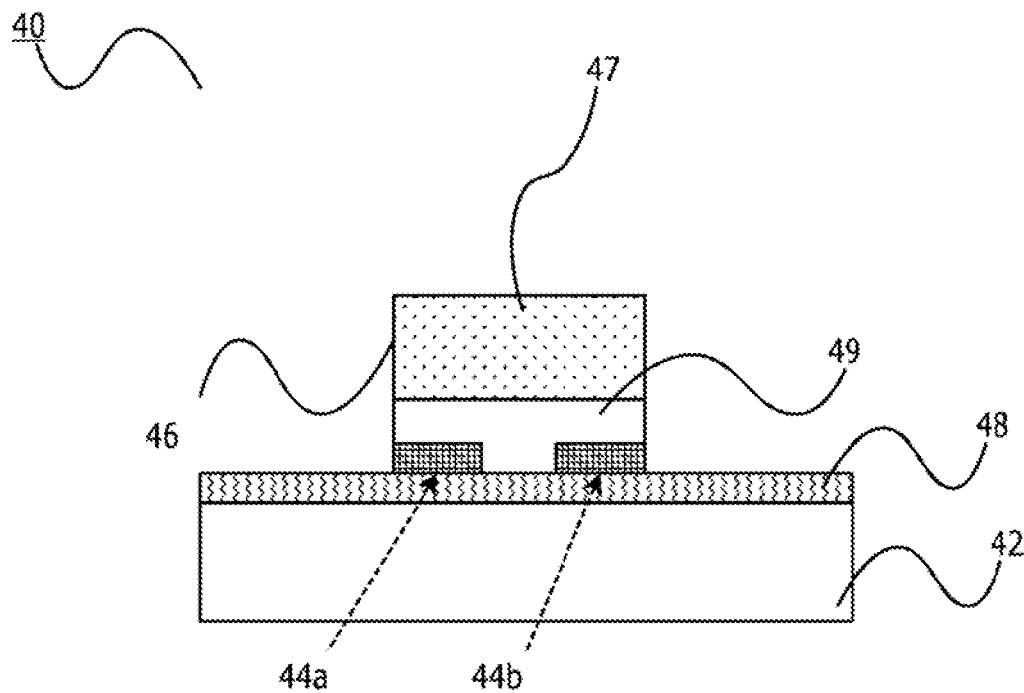

[Figure 5]
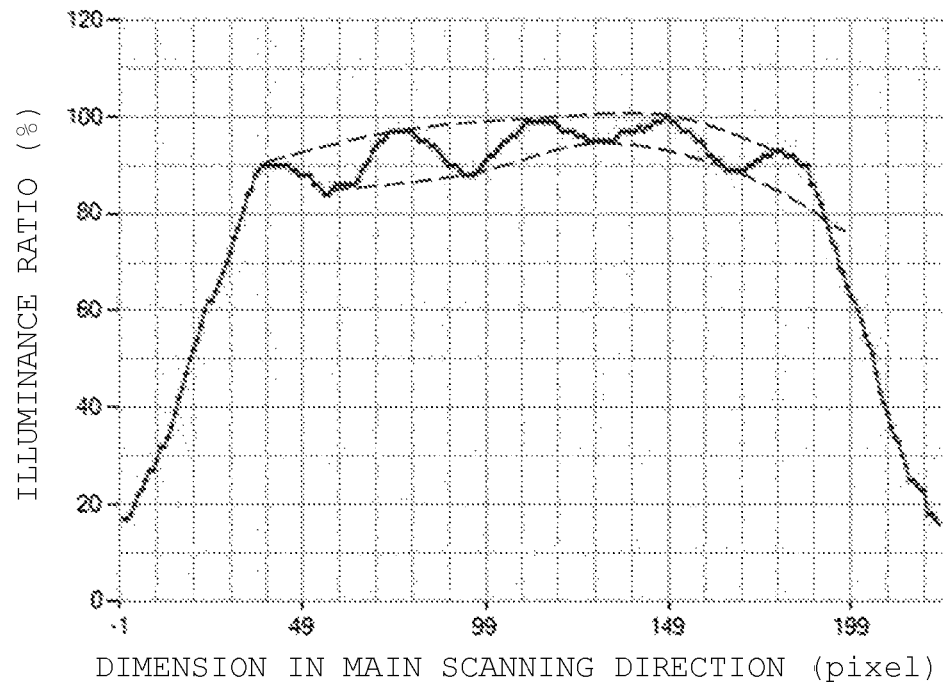
[Figure 6]
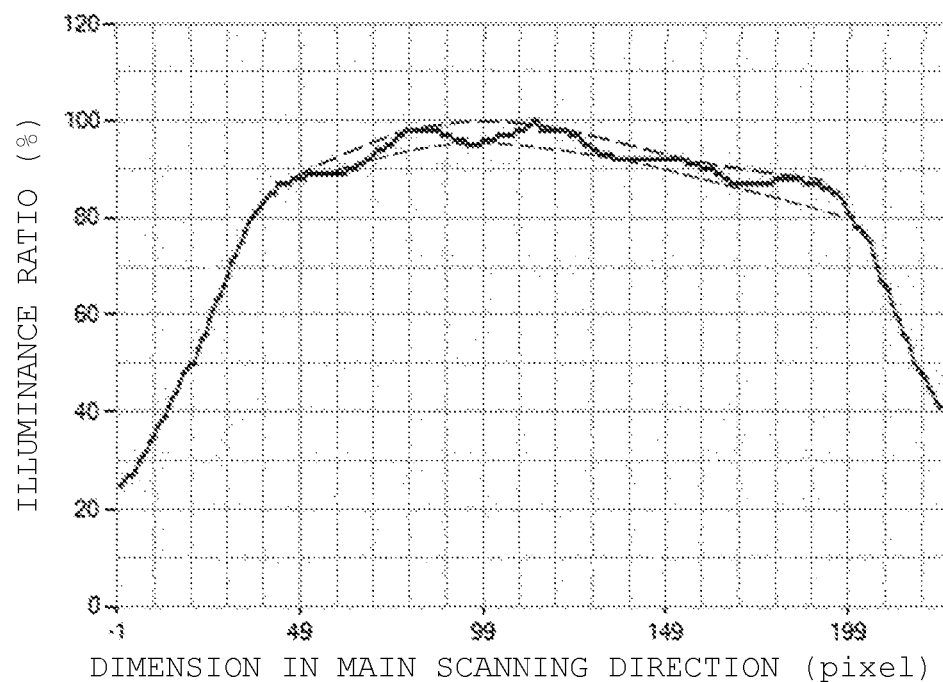

[Figure 7]
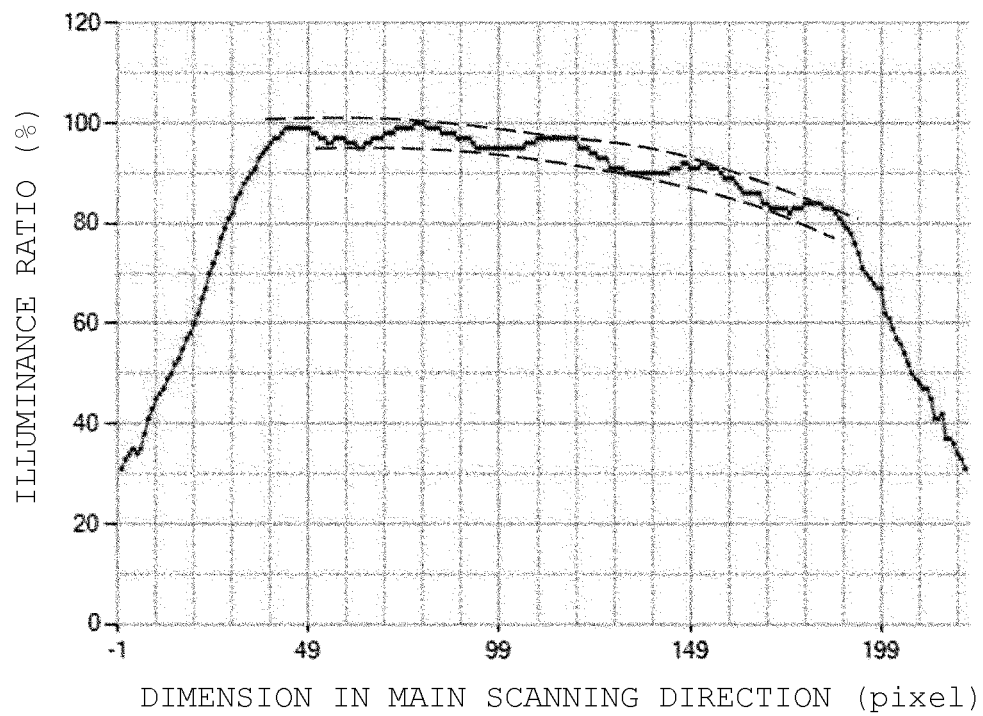

LIGHTING APPARATUS HAVING MOUNTING SUBSTRATE FOR LED LIGHTING

TECHNICAL FIELD

The present invention relates to a lighting apparatus having a substrate on which a plurality of surface mount-type LED (Light Emitting Diode) elements are mounted.

BACKGROUND ART

While LED lighting fixtures (apparatuses) are spreading, their variations are increasing as well as indoor ones for houses, such as ones for high ceilings, and outdoor ones. Larger-size LED lighting fixtures are accordingly spreading, resulting in higher-power ones.

Present elements for LED lighting are roughly categorized so far into an SMD (Surface Mounted Devices) type in which about one to four pcs (pieces) of LED chips are housed in one package and a plurality of sets of these packages are mounted on a PWB (Printed Wired Board), and a COB (Chip On Board) type in which a plurality of LED chips are collectively mounted on one substrate and sealed into one device and which secures its power with this one device.

While there have been conventionally used for the SMD type some devices in each of which LED chips are mounted on a package resin-molded on a lead frame and they are sealed with fluorescent substance-containing resin, it is starting to employ devices of a CSP (Chip Scale Package) type which is package-less with a configuration of high-power LED chips and fluorescent substance resin only in which the LED chips are covered with the fluorescent substance resin. Since the SMD type may have devices dispersedly mounted, it allows flexible design for heat dissipation of a lighting fixture and diversity in design with various device arrangements.

For lighting fixtures each having SMD-type LED elements, it has not been able to solve a fundamental problem that since the individual elements independently emit high-power light, this significantly causes glare and multiple shadows on the lighting fixture as a whole. Moreover, use of CSP elements, which have higher power, causes all the more significant glare and multiple shadows. Although in order to prevent glare and multiple shadows, some lighting fixtures are provided with a diffusion plate (cover) as measures against those, this is less meaningful since such high power shrinks due to that cover.

Moreover, the COB type may achieve single-device high power, and advantageously facilitates light control (lighting design) due to its single core (including only one sealing body). Since such a high-power lighting fixture however has a high degree of concentration of heat, a COB-type lighting fixture needs an excessively large heat dissipation component depending on the size and the power of LED elements in accordance with the concentrated heat, which problematically causes difficulty in design for heat dissipation that matches the structure of the fixture as a whole. Multipurpose, high-power COB-type lighting fixtures are therefore limited to achieve.

Furthermore, in the case of achieving high-power COB-type lighting fixtures, when a face-up type is used in which wires are used for LED elements, there arises a concern that wire breakage tends to occur due to increase of the wires along with increase of chips for such high power, as well as the problem of heat dissipation. Although this results in proposing use of flip chip-type LED elements in place of face-up-type ones, there is a concern that flip chip-type LED elements may cause junction leakage in mounting, and there is also a problem that the mounting needs an exclusive facility, which are obstacles against the use of COB-type lighting fixtures.

In such circumstances, COB-type lighting fixtures have not been able to achieve sufficient high power.

Although it is proposed to provide a reflective material on the surface of a substrate for enhancing light emission efficiency of an LED lighting fixture (Patent Literature 1), particularly in the case of the SMD type with a multicore configuration, the problem of glare and multiple shadows are not able to be sufficiently solved due to uneven reflected light from such a reflective material.

CITATION LIST

Patent Literature

Patent Literature 1
Chinese Patent Application Publication No. 106163113

SUMMARY OF INVENTION

Technical Problem

In consideration of the aforementioned limitations in the conventional art, there is desired a novel technology to solve the problem of glare and multiple shadows arising on the SMD type, in LED lighting fixtures with very high power that is not able to be achieved by the COB type.

Solution to Problem

Embodiments of the present invention may provide the followings.

[1] A lighting apparatus including:
a substrate having a plurality of conduction parts; and
a plurality of surface mount-type LED elements mounted so as to be connected to the respective plurality of conduction parts which the substrate has, the individual elements being separately sealed, wherein
the substrate includes a fluorescent substance layer containing a first fluorescent substance, the layer covering at least part of a surface on a side where the plurality of surface mount-type LED elements are mounted,
the first fluorescent substance is excited at a wavelength of emitted light from at least one of the plurality of surface mount-type LED elements, and
the plurality of surface mount-type LED elements are not integrally sealed.
[2] The lighting apparatus according to [1], wherein the substrate further includes a reflective layer.
[3] The lighting apparatus according to [2], wherein the reflective layer is adjacent to the fluorescent substance layer.
[4] The lighting apparatus according to any one of [1] to [3], wherein at least one of the plurality of conduction parts is positioned beneath a surface of the fluorescent substance layer in terms of a thickness direction of the substrate.
[5] The lighting apparatus according to any one of [1] to [4], wherein at least one of the plurality of conduction parts is positioned at a same height as that of a surface of the fluorescent substance layer or positioned above the surface of the fluorescent substance layer, in terms of a thickness direction of the substrate.

[6] The lighting apparatus according to any one of [1] to [5], wherein the plurality of surface mount-type LED elements are one or more kinds of LED elements selected from the group consisting of CSP elements, SMD elements, and flip chip elements.

[7] The lighting apparatus according to any one of [1] to [6], wherein at least one of the plurality of surface mount-type LED elements has a sealing body for sealing the LED element itself.

[8] The lighting apparatus according to [7], wherein the sealing body contains a second fluorescent substance.

[9] The lighting apparatus according to any one of [1] to [8], wherein
at least one of the plurality of surface mount-type LED elements is a flip chip element, and
the flip chip element does not have a reflective film on a side in contact with the substrate.

[10] The lighting apparatus according to any one of [1] to [9], wherein
the surface mount-type LED elements include a first surface mount-type LED element having a first wavelength of emitted light and a second surface mount-type LED element having a second wavelength of emitted light,
the first fluorescent substance contained in the fluorescent substance layer is excited by emitted light from the first surface mount-type LED element and/or emitted light from the second surface mount-type LED element, and
a difference in x value in CIE chromaticity coordinate is not greater than 1.0, and a difference in y value therein is not greater than 1.0, between a wavelength of emitted light from the first fluorescent substance and a wavelength of emitted light from the second surface mount-type LED element.

Advantageous Effects of Invention

The lighting apparatus provided according to embodiments of the present invention effectively reduce or prevent glare and multiple shadows even with its high power.

BRIEF DESCRIPTION OF DRAWINGS

FIG. 1 is a cross-sectional view schematically showing a lighting apparatus 10 according to a first embodiment of the present invention.

FIG. 2 is a cross-sectional view schematically showing a lighting apparatus 20 according to a second embodiment of the present invention.

FIG. 3 is a cross-sectional view schematically showing a lighting apparatus 30 according to a third embodiment of the present invention.

FIG. 4 is an expanded cross-sectional view schematically showing a lighting apparatus 40 according to a fourth embodiment of the present invention.

FIG. 5 is an illuminance ratio distribution graph obtained from a test piece according to Comparative Example 1.

FIG. 6 is an illuminance ratio distribution graph obtained from a test piece according to Example 1.

FIG. 7 is an illuminance ratio distribution graph obtained from a test piece according to Example 2.

DESCRIPTION OF EMBODIMENTS

Definitions

In the present specification, surface mount-type LED elements (SMD type) each designates a surface mount-type LED element on which an LED bare chip is packaged, and are defined as not including COB-type (which are collectively sealed LED elements). Namely, a lighting apparatus according to an embodiment of the present invention has a plurality of SMD-type LED elements, the individual elements being separately sealed.

In the present specification, SMD-type elements include CSP-type elements and flip chips (flip chip elements). The flip chips (flip chip elements) stated herein include ones in modes of not having any lower reflective films as mentioned later.

In the present specification, a "fluorescent substance layer" designates a layer containing a so-called inorganic fluorescent substance. There may be an embodiment, for the present invention, in which the "fluorescent substance layer" containing an additional organic fluorescent dye (so-called fluorescent brightener). Any "fluorescent substance layer" in the present specification does not include a layer that contains the organic fluorescent dye and does not contain the inorganic fluorescent substance (e.g., reflective material layer).

Any numerical range in the present specification is defined as including its upper limit value and lower limit value unless otherwise noted.

As to the upward direction and the downward direction in the thickness direction of a substrate in the present specification, being in the upward direction is defined as being on one, of the sides thereof, where surface mount-type LED elements are mounted, and being in the downward direction is defined as being on the other, unless otherwise noted. In principle, the drawings also show the surface on the side where surface mount-type LED elements are mounted as being in the upward direction.

First Embodiment

FIG. 1 schematically shows a lighting apparatus 10 according to a first embodiment of the present invention. FIG. 1 is a cross-sectional view of the lighting apparatus 10. Note that the drawings are extremely exaggerated in terms of features and measurements in the thickness direction for the sake of understandability. The lighting apparatus 10 has a substrate 12 having a plurality of conduction parts 14, and a plurality of surface mount-type LED elements 16 are mounted so as to be connected to the respective plurality of conduction parts 14. Mount patterns (not shown) including lead wires are connected to the respective plurality of conduction parts 14, and may supply power to the respective surface mount-type LED elements 16. The individual surface mount-type LED elements 16 may be separately sealed with sealing materials (not shown), but any such elements of those are not integrally sealed (that is, any of those are not of the COB type). Notably, while FIG. 1 shows three surface mount-type LED elements 16 and as many conduction parts 14, which are merely exemplary, they may be more or less than three of course. Moreover, there may be an embodiment in which the number of surface mount-type LED elements 16 is smaller than the number of conduction parts 14 (that is, extra conduction parts are not used).

While as the aforementioned sealing material, any material known in the relevant technical field may be used, a silicone resin by way of example may be preferably used in view of translucency and thermal resistance. In another embodiment, such a sealing material does not have to be used. In still another embodiment, only a part of the surface mount-type LED elements 16 may be sealed, the rest not being sealed.

In an embodiment, the aforementioned sealing material may further contain, in addition to a fluorescent substance (first fluorescent substance) contained in a fluorescent substance layer 18, a second fluorescent substance. The second fluorescent substance may be the same substance as the first fluorescent substance or may be a different substance. Such a fluorescent substance contained also in the sealing material may further improve light emission efficiency and adjust chromaticity.

Furthermore, on the substrate 12, the fluorescent substance layer 18 is provided on a surface on the side where the surface mount-type LED elements 16 are mounted. The fluorescent substance layer 18 contains a fluorescent substance which is excited by light output from the surface mount-type LED elements 16. Further, since emitted light from the fluorescent substance (fluorescence) results in light emission of at least part of (preferably, the whole) fluorescent substance layer 18, a pseudo-single-core light emission configuration may be realized. In other words, the presence of the fluorescent substance layer 18 may attain remarkable effects of reducing or preventing glare and multiple shadows which conventional SMD-type lighting fixtures have not been able to solve, and in addition, eliminating the disadvantages of COB-type lighting fixtures.

Notably, while FIG. 1 shows a mode in which the conduction parts 14 and the surface mount-type LED elements 16 line up, which is merely exemplary. There may be an embodiment in which the conduction parts 14 and the surface mount-type LED elements 16 are arranged into a plurality of lines. In view of improving power of the lighting fixture as a whole, the surface mount-type LED elements 16 preferably constitute an m×n matrix (m and n are integers not smaller than two). The matrix may take any configuration such, for example, as a standard (rectangular) one or a houndstooth check (interstitial) one.

While the material of the substrate 12 is not specially limited as long as it is used for a PWB (printed circuit board) in the technical field, it may employ a polyimide resin, a silicone resin, an acrylic resin, a urea resin, an epoxy resin, a fluorine resin, glass, a metal (e.g., aluminum, copper, iron, stainless steel), for example. In view of thermal resistance, a polyimide resin, a silicone resin, glass, or a metal (a so-called "metal board" in which aluminum or copper is used as a base metal and an insulating layer is provided) may be preferably used. Moreover, in view of heat dissipation, a metal similar to the above may be preferably used. The thickness of the substrate 12 is not specially limited as long as it is within a range usable for a lighting fixture, but may be exemplarily about 0.1 to 100 mm or 1 to 10 mm.

The conduction parts 14 are connected to the surface mount-type LED elements 16 and have a function of supplying power supplied from a power source to the surface mount-type LED elements 16. The way of their connection may be joining with solder or conductive paste or may be connection with detachable socket and plug. Notably, each conduction part 14 may include a plurality of electrodes (n-electrode, p-electrode and the like; they are omitted from FIG. 1). The conduction parts 14 may be made from a conductive substance (e.g., silver, copper) and typically are connected to mount patterns (not shown) included in the substrate 12. FIG. 1 shows a mode in which the conduction parts 14 are beneath the surface and the lower surface of the fluorescent substance layer 18 (namely, are positioned beneath the surface of the fluorescent substance layer 18 in terms of the thickness direction of the substrate 12). In another embodiment, the conduction parts 14 may be positioned at the same height as that of the surface of the fluorescent substance layer 18 or may be positioned above the surface of the fluorescent substance layer 18, in terms of the thickness direction of the substrate 12. In still another embodiment, there may be a configuration in which the individual conduction parts 14 are positioned at different heights in terms of the thickness direction of the substrate 12.

The surface mount-type LED elements 16 exemplarily include CSP elements, SMD elements and flip chip elements. When flip chip elements are used, they may be used without their lower reflective films (reflective films typically on the side of mounting on the substrate) employed, which will be mentioned later again.

Any color of emitted light and any chromaticity usable for a lighting fixture may be selected for the surface mount-type LED elements 16, and the color of emitted light of the lighting fixture as a whole may be properly adjusted based on a combination of those and the color of emitted light and the chromaticity of the fluorescent substance layer 18. The fluorescent substance layer 18 preferably contains a fluorescent substance that is excited at a wavelength of emitted light from the surface mount-type LED elements 16 to emit light such that the chromaticity of the lighting fixture is properly adjustable. For example, in an embodiment, emitted light from the surface mount-type LED elements 16 and emitted light from the fluorescent substance layer 18 may have the same CIE values, or a difference in x value and a difference in y value between those in CIE chromaticity coordinates may be not greater than 0.1.

In an embodiment, both emitted light from the surface mount-type LED elements 16 and emitted light from the fluorescent substance layer 18 may be set to be white or pseudo-white (based on a combination yellow and blue or another combination). In another embodiment, the surface mount-type LED elements 16 may include first surface mount-type LED elements which emit light of a single color such as red or green, and second surface mount-type LED elements which emit light of a single blue color. The fluorescent substance contained in the fluorescent substance layer 18 may be excited by any of emitted light from the first surface mount-type LED elements and emitted light from the second surface mount-type LED elements to emit light. The color of emitted light of the fluorescent substance contained in the fluorescent substance layer 18 may be exemplarily red, green or blue. As a result of such a configuration, by properly adjusting a combination of the color of emitted light from the LED elements and the color of emitted light from the fluorescent substance, the emitted light from the lighting fixture as a whole may also be white or pseudo-white.

While the fluorescent substance (inorganic fluorescent substance) which may be included in the fluorescent substance layer 18 is not specially limited as long as it is usable in the technical field, a so-called sialon fluorescent substance (α-SiAlON, β-SiAlON or the like), a CASN fluorescent substance, a γ-AlON fluorescent substance, a YAG fluorescent substance, a TAG fluorescent substance, a BOS fluorescent substance or the like may be exemplarily selected and used depending on a wanted color of emitted light.

In view of light emission efficiency, an area occupied by the fluorescent substance layer 18 on the surface of the substrate 12 is preferably substantially the entire surface of the substrate 12 (that is, the entire surface thereof except portions occupied by the conduction parts 14 and the surface mount-type LED elements 16). Thereby, the whole substrate 12 is allowed to emit light and a pseudo-single-core configuration may be preferably realized. In another embodiment, the fluorescent substance layer 18 may occupy a part of (for example, 80% of, 70% of, 60% of, or a half) the surface of the substrate 12. In such a case, the part thereof occupied by the fluorescent substance layer 18 may form a segment on the substrate 12, or the fluorescent substance layer 18 may be discrete (for example, formed into a checkered pattern) on the substrate 12.

In another embodiment, the substrate 12 may also work as the fluorescent substance layer 18. In other words, the substrate 12 may be formed of a material in which a fluorescent substance is kneaded. As such a material, known glass binder (YPT531E made by AGC Inc, or the like) or an acrylic binder resin may be exemplarily used.

While the thickness of the fluorescent substance layer 18 is not specially limited as long as a light emission function thereof is attained, it may be exemplarily a thickness within a range from about 0.1 to about 10.0 mm, preferably a thickness from about 0.05 mm to about 1.0 mm, further preferably a thickness from about 0.1 mm to about 0.5 mm. While any technique may be employed for forming the fluorescent substance layer 18 on the substrate 12, for example, a fluorescent substance may be mixed into an arbitrary resin material (silicone resin or the like), followed by its coating (printing) on the substrate 12, or a sheet formed of the fluorescent substance and the resin material (bores may be formed in it so as not to disturb the function of the conduction parts 14) may be placed on the substrate 12, or powder of the fluorescent substance may be directly applied to adhere onto the substrate 12. The fluorescent substance layer 18 may be formed before the surface mount-type LED elements 16 are mounted, or if possible, after the surface mount-type LED elements 16 are mounted. For example, in an embodiment, the sheet as mentioned above may be pasted onto the substrate 12 that the surface mount-type LED elements 16 have been already mounted by the surface mount-type LED elements 16 being put through the bores so as to be exposed, which allows the fluorescent substance layer 18 to be easily provided.

The substrate 12 may further include, in addition to the fluorescent substance layer 18, a reflective layer (not shown) for further enhancing light extraction efficiency. While the reflective layer may exemplarily include an organic fluorescent dye, crushed glass pieces and the like, they preferably do not cause glare or multiple shadows of course. While the reflective layer may be placed at any position, it may be arranged, for example, to be adjacent to (in contact with) the fluorescent substance layer 18, and it is preferably arranged to be adjacent to and right beneath the fluorescent substance layer 18 in view of improving the light extraction efficiency. The reflective layer still preferably has insulation in view of electric stability of the lighting apparatus.

Second Embodiment

FIG. 2 schematically shows a cross-sectional view of a lighting apparatus 20 according to a second embodiment of the present invention. Similarly to the lighting apparatus 10 according to the first embodiment, the lighting apparatus 20 has a substrate 22 having a plurality of conduction parts 24, and a plurality of surface mount-type LED elements 26 are mounted so as to be connected to the respective plurality of conduction parts 24.

The lighting apparatus 20 is different from the lighting apparatus 10 in that the conduction parts 24 are connected to mount patterns (not shown), and both the conduction parts 24 and mount patterns are positioned on a fluorescent substance layer 28. Namely, in the second embodiment, after the fluorescent substance layer 28 is provided on the substrate 22, the mount patterns are provided further thereon. With such a configuration, it is not needed to provide the fluorescent substance layer 28 that has bores to keep the conduction parts 24 from itself, which effectively attains excellent workability in production. The other features of the lighting apparatus 20 may be configured to be similar to those of the first embodiment mentioned above.

Third Embodiment

FIG. 3 schematically shows a cross-sectional view of a lighting apparatus 30 according to a third embodiment of the present invention. Similarly to the lighting apparatus 10 according to the first embodiment, the lighting apparatus 30 has a substrate 32 having a plurality of conduction parts 34, and a plurality of surface mount-type LED elements 36 are mounted so as to be connected to the respective plurality of conduction parts 34.

The conduction parts 34 are connected to a mount pattern 35 formed on the substrate 32. A fluorescent substance layer 38 is provided on the mount pattern 35. The conduction parts 34 take a configuration in which they are exposed from and above the fluorescent substance layer 38. With such a configuration, the thickness of the mount pattern 35 may be made large, which effectively enables heat generated by conduction of electricity to be efficiently dissipated. Moreover, since the conduction parts 34 are exposed from and above the fluorescent substance layer 38, the surface mount-type LED element 36 is also effectively made easily mounted. The other features of the lighting apparatus 30 may be configured to be similar to those of the first embodiment mentioned above.

Fourth Embodiment

FIG. 4 shows a schematic diagram of a lighting apparatus 40 according to a fourth embodiment of the present invention which employs flip chip elements with a special configuration. It should be understood that being different from FIGS. 1 to 3, FIG. 4 is a diagram only having one of a plurality of surface mount-type LED elements 46 and its periphery extremely expanded.

The lighting apparatus 40 has a substrate 42, and has a fluorescent substance layer 48 on the substrate 42. The surface mount-type LED element 46 which is a flip chip element has a substrate (sapphire substrate or the like) 47 for packaging itself, a light-emitting part/crystal layer 49, a p-electrode 44a and an n-electrode 44b. The p-electrode 44a and the n-electrode 44b are connected to mount patterns (not shown) via conduction parts (not shown) of the substrate 42. Although according to the conventional art, the flip chip element 46 has a lower reflective film on a surface on the side where it is mounted on the substrate, it does not have such a reflective film in the embodiment. Such a reflective film is needed for light extraction in a typical flip chip element, which has a light-emitting part near (at micrometers of distance from the substrate surface in general) the lower surface (surface on the side of mounting). On the contrary, a reflective film is not needed in the embodiment since the fluorescent substance layer 48 plays a role of the light extraction. With such a configuration, the production process is significantly effectively made largely simple. Notably, in another embodiment, a conventional lower reflective film may be provided in the flip chip element.

The other features of the lighting apparatus 40 may be configured to be similar to those of the first embodiment mentioned above.

Moreover, when a CSP based on a flip chip element is used as the LED element as in the fourth embodiment, the periphery of such a CSP-type LED element may be sealed with a sealing material containing the fluorescent substance mentioned above for the first embodiment. With such a configuration, junction leakage in mounting the CSP-type LED element may be prevented by the sealing material. Easy mounting as above enables reduction of necessity for an exclusive facility and enables high power which has been difficult for the COB type to realize.

EXAMPLES

The present invention will be hereafter further described with some examples and comparative example, which does not limit the scope of the present invention.

Comparative Example 1

Zirconium oxide (HSY-3 W, Daiichi Kigenso Kagaku Kogyo Co. Ltd.) in 50 vol % was mixed with silicone resin (OE-6630, Dow Corning Toray Co. Ltd., a compound of A and B materials in a weight ratio of A/B=1/4). The raw resin mixture above was poured into a stainless steel-made mold with dimensions of 50 mm×50 mm and 3 mm of depth on which DAIFREE GA-7550 (Daikin Industries Ltd.) was applied as a mold release agent, was heated under primary setting conditions of 100° C. and 1 hour, and then, was heated under secondary setting conditions of 150° C. and 1 hour, affording a white substrate.

Using Ag paste (EPS-110A, Muromachi Chemicals Inc.), a matrix pattern with five columns and five rows (5×5) was printed on the white substrate via a SUS 200-mesh 3D screen printing plate, was heated under primary setting conditions of 80° C. and 30 minutes, and then, was heated under secondary setting conditions of 150° C. and 2 hours, forming mount patterns on the white substrate.

On the white substrate, CSPs, WICOP SZ8-Y15-WW-C8 (Seoul Semiconductor Co. Ltd.), were mounted and joined using Ag paste (EPS-110A, Muromachi Chemicals Inc.), affording a test piece according to Comparative Example 1.

Example 1

A test piece according to Example 1 was obtained similarly to Comparative Example 1 except that in preparing the aforementioned raw resin mixture, the 1:3 (weight ratio) mixture of ALONBRIGHT GRMW540K8SD (Denka Co. Ltd.) as a green fluorescent substance and ALONBRIGHT KR2K01 (Denka Co. Ltd.) as a red fluorescent substance, in 30 vol %, was further kneaded into the silicone resin.

Example 2

A glass substrate with dimensions of 50 mm×50 mm and 3 mm of thickness was prepared. On the surface of the glass substrate, glass binder paint (commercially available) into which the 1:3 (weight ratio) mixture of ALONBRIGHT GRMW540K8SD (Denka Co. Ltd.) and ALONBRIGHT KR2K01 (Denka Co. Ltd.) as fluorescent substances, in 30 vol %, was mixed was applied to have 200 μm of thickness, forming a fluorescent substance layer.

Using Ag paste (EPS-110A, Muromachi Chemicals Inc.), a matrix pattern with five columns and five rows (5×5) was printed on the glass substrate via a SUS 200-mesh 3D screen printing plate, was heated under primary conditions of 80° C. and 30 minutes, and then, was heated under secondary conditions of 150° C. and 2 hours, forming mount patterns on the glass substrate.

On the glass substrate, CSPs, WICOP SZ8-Y15-WW-C8 (Seoul Semiconductor Co. Ltd.), were mounted and joined using Ag paste (EPS-110A, Muromachi Chemicals Inc.), affording a test piece according to Example 2.

Evaluation

A glass plate for observation with 3 mm of thickness was placed to be spaced above from a mount surface of each test piece by 5 mm, and on the glass plate for observation, a diffusion sheet with 0.1 mm of thickness (75PBA, KIMOTO Co. Ltd.) was placed. An S-MOS camera was placed to be spaced above from the diffusion sheet by 316 mm.

In the state of causing the CSPs to emit light by conduction of electricity (12 V for every five CSPs in series, 0.8 mA/each) through application of voltage to the test piece, the test piece was photographed by the camera. Illuminance on the line above the row of the CSPs was measured from the image thus obtained, and a graph of the illuminance ratio (%) and a dimension in the main scanning direction (pixel) was created. FIG. 5 shows that of Comparative Example 1, FIG. 6 shows that of Example 1, and FIG. 7 shows that of Example 2. Broken lines in each graph are curves obtained by fittingly approximating local maximums and local minimums of the illuminance ratio, respectively.

In Comparative Example 1, drops in illuminance ratio at the portions corresponding to the gaps between the CSPs were large and about 88% relative to the CSP TOP surface. Accordingly, it was suggested that in Comparative Example 1 according to the conventional art, the problem of glare and multiple shadows arose.

Meanwhile, in each of Example 1 and Example 2, drops in illuminance ratio at the gaps between the CSPs were small and maintained up to about 95% relative to the CSP TOP surface. Accordingly, it was confirmed that in Example 1 and Example 2 according to the present invention, the problem of glare and multiple shadows was effectively reduced or prevented.

REFERENCE SIGNS LIST

10 Lighting apparatus
12 Substrate
14 Conduction part
16 Surface mount-type LED element
18 Fluorescent substance layer
20 Lighting apparatus
22 Substrate
24 Conduction part
26 Surface mount-type LED element
28 Fluorescent substance layer
30 Lighting apparatus
32 Substrate
34 Conduction part
35 Mount pattern
36 Surface mount-type LED element
38 Fluorescent substance layer
40 Lighting apparatus
42 Substrate
44a p-Electrode
44b n-Electrode
46 Surface mount-type LED element (flip chip element)

47 Substrate for a package
48 Fluorescent substance layer
49 Light-emitting part/crystal layer

The invention claimed is:

1. A lighting apparatus comprising:
a substrate having a plurality of conduction parts; and
a plurality of surface mount-type LED elements mounted so as to be connected to the respective plurality of conduction parts which the substrate has, the individual elements being separately sealed, wherein
each surface mount-type LED element contains a single LED bare chip,
the substrate includes a fluorescent substance layer containing a first fluorescent substance, the layer covering at least part of a surface on a side where the plurality of surface mount-type LED elements are mounted,
the first fluorescent substance is excited at a wavelength of emitted light from at least one of the plurality of surface mount-type LED elements, and
the plurality of surface mount-type LED elements are not integrally sealed.

2. The lighting apparatus according to claim 1, wherein the substrate further includes a reflective layer.

3. The lighting apparatus according to claim 2, wherein the reflective layer is adjacent to the fluorescent substance layer.

4. The lighting apparatus according to claim 1, wherein at least one of the plurality of conduction parts is positioned beneath a surface of the fluorescent substance layer in terms of a thickness direction of the substrate.

5. The lighting apparatus according to claim 1, wherein at least one of the plurality of conduction parts is positioned at a same height as that of a surface of the fluorescent substance layer or positioned above the surface of the fluorescent substance layer, in terms of a thickness direction of the substrate.

6. The lighting apparatus according to claim 1, wherein the plurality of surface mount-type LED elements are one or more kinds of LED elements selected from the group consisting of CSP elements, SMD elements, and flip chip elements.

7. The lighting apparatus according to claim 1, wherein at least one of the plurality of surface mount-type LED elements has a sealing body for sealing the LED element itself.

8. The lighting apparatus according to claim 7, wherein the sealing body contains a second fluorescent substance.

9. The lighting apparatus according to claim 1, wherein
at least one of the plurality of surface mount-type LED elements is a flip chip element, and
the flip chip element does not have a reflective film on a side in contact with the substrate.

10. The lighting apparatus according to claim 1, wherein
the surface mount-type LED elements include a first surface mount-type LED element having a first wavelength of emitted light and a second surface mount-type LED element having a second wavelength of emitted light,
the first fluorescent substance contained in the fluorescent substance layer is excited by emitted light from the first surface mount-type LED element and/or emitted light from the second surface mount-type LED element, and
a difference in x value in CIE chromaticity coordinate is not greater than 1.0, and a difference in y value therein is not greater than 1.0, between a wavelength of emitted light from the first fluorescent substance and a wavelength of emitted light from the second surface mount-type LED element.

* * * * *